US011223329B2

(12) United States Patent
Banerjee et al.

(10) Patent No.: US 11,223,329 B2
(45) Date of Patent: Jan. 11, 2022

(54) STACKED SEGMENTED POWER AMPLIFIER CIRCUITRY AND A METHOD FOR CONTROLLING A STACKED SEGMENTED POWER AMPLIFIER CIRCUITRY

(71) Applicants: IMEC USA NANOELECTRONICS DESIGN CENTER, Inc., Kissimmee, FL (US); IMEC VZW, Leuven (BE)

(72) Inventors: Aritra Banerjee, Orlando, FL (US); Pierre Wambacq, Groot-Bijgaarden (BE)

(73) Assignees: IMEC USA NANOELECTRONICS DESIGN CENTER, Inc., Kissimmee, FL (US); IMEC VZW, Leuven (BE)

( * ) Notice: Subject to any disclaimer, the term of this patent is extended or adjusted under 35 U.S.C. 154(b) by 73 days.

(21) Appl. No.: 16/788,696

(22) Filed: Feb. 12, 2020

(65) Prior Publication Data

US 2021/0249996 A1 Aug. 12, 2021

(51) Int. Cl.
*H03F 1/22* (2006.01)
*H03F 1/30* (2006.01)
(Continued)

(52) U.S. Cl.
CPC ........... *H03F 1/301* (2013.01); *H03F 1/0211* (2013.01); *H03F 1/3205* (2013.01);
(Continued)

(58) Field of Classification Search
CPC ...... H03F 1/301; H03F 1/0211; H03F 1/3205; H03F 1/3211; H03F 3/213;
(Continued)

(56) References Cited

U.S. PATENT DOCUMENTS

| 10,291,183 | B1* | 5/2019 | Syed | .................... H03F 1/0261 |
| 2018/0167038 | A1 | 6/2018 | Lee et al. | |
| 2020/0127617 | A1* | 4/2020 | Shah | ........................ H03F 1/22 |

OTHER PUBLICATIONS

Larie et al., "A 60GHz 28nm UTBB FD-SOI CMOS Reconfigurable Power Amplifier with 21% PAE, 18.2dBm P1dB and 74mW PDC", ISSCC/ Session 2 / RF TX/RX Design Techniques / 2.10. 2015.
(Continued)

*Primary Examiner* — Khanh V Nguyen
(74) *Attorney, Agent, or Firm* — Moser Taboada (57) ABSTRACT

A power amplifier circuitry (100) comprises: a transistor stack (110) comprising at least two stacked transistor units (112A, 112B, 112C) for amplifying input signals; wherein each stacked transistor unit (112A, 112B, 112C) comprises a plurality of controllable segments (120-1 to 120-N, 130-1 to 130-N, 140-1 to 140-N), each comprising a segment transistor (122, 132, 142), wherein source terminals (123, 133, 143) within each transistor unit are connected, drain terminals (125, 135, 145) within each transistor unit are connected and gate terminals (124, 134, 144) within each transistor unit are connected, wherein each segment transistor (122, 132, 142) further comprises a back gate terminal (126, 136, 146) for setting a body bias, wherein at least two of the segment transistors (122, 132, 142) within each transistor unit have independently connected back gate terminals (126, 136, 146); and a control unit (190) configured to control the body bias for selecting an amplifier class of each of the controllable segments (120-1 to 120-N, 130-1 to 130-N, 140-1 to 140-N) of each of the stacked transistor units (112A, 112B, 112C).

20 Claims, 4 Drawing Sheets

(51) Int. Cl.
- *H03F 3/213* (2006.01)
- *H03F 1/02* (2006.01)
- *H03F 1/32* (2006.01)
- *H03F 3/45* (2006.01)
- *H03G 3/30* (2006.01)

(52) U.S. Cl.
CPC ........... *H03F 1/3211* (2013.01); *H03F 3/213* (2013.01); *H03F 3/45179* (2013.01); *H03G 3/3042* (2013.01); *H03F 2200/451* (2013.01); *H03F 2200/465* (2013.01); *H03F 2200/534* (2013.01); *H03F 2203/45352* (2013.01)

(58) Field of Classification Search
CPC ........... H03F 3/45179; H03F 2200/465; H03F 2203/45352; H03F 1/223; H03F 1/22; H03F 2200/294; H03G 3/3042
USPC .......................................................... 330/311
See application file for complete search history.

(56) References Cited

OTHER PUBLICATIONS

Martineau et al., "Opportunity of CMOS FD-SOI for RF Power Amplifier", IEEE, CEA-LETI, 17, rue des Martyrs, 38054 Grenoble, France Université de Grenoble-Alpes, 38000 Grenoble, France, 2017.

Moret et al., "A 28GHz Self-Contained Power Amplifier for 5G applications in 28nm FD-SOI CMOS", IEEE, STMicroelectronics, Technology and Design Platform, Crolles France, University of Bordeaux, IMS laboratory, CNRS UMR 5218, Bordeaux INP Talence, France, 2017.

Rao et al., "Body Biasing for Analog Design: Practical Experiences in 22 nm FD-SOI", IEEE, Fraunhofer IIS/EAS, Institute for Integrated Circuits, Division Engineering of Adaptive Systems, Dresden, Germany, 2017.

Mayeda et al., "A 24-28GHz Reconfigurable CMOS Power Amplifier in 22nm FD-SOI for Intelligent SoC Applications", IEEE, Dept. of Electrical and Computer Engineering Texas Tech University (TTU) Lubbock, 2018.

* cited by examiner

STACKED SEGMENTED POWER AMPLIFIER CIRCUITRY AND A METHOD FOR CONTROLLING A STACKED SEGMENTED POWER AMPLIFIER CIRCUITRY

TECHNICAL FIELD

The present inventive concept relates to a stacked segmented power amplifier circuitry and a method for controlling the stacked segmented power amplifier circuitry. In particular, the present inventive concept relates to a power amplifier circuitry that is suitable for radio frequency and millimeter wave amplification.

BACKGROUND

Power amplifiers are used in essentially any electronic circuitry. Power amplifiers may for example be used in integrated circuits, which sets specific demands on e.g. size of components. Power amplifiers may, at least in some instances, face the following problems.

Output power of power amplifiers, particularly for integrated power amplifiers may be limited and it may be very difficult to increase output power of the power amplifier. Linearity, such as output 1 dB compression point (OP1dB), of the power amplifier may be low due to non-linearities of components and circuits. The integrated power amplifier may be subject to variations such as process, voltage and temperature (PVT) variations and variations due to aging. Such variations may alter characteristics of the power amplifier, such as the OP1dB.

In U.S. Pat. No. 10,291,183 an apparatus is disclosed, comprising an input transformer; a first differential transistor pair configured to receive a first back gate bias voltage; a second differential transistor pair configured to receive a second back gate bias voltage; a cross-coupled neutralization cap comprising PMOS or NMOS transistors and configured to receive a third back gate bias voltage; and an output transformer. A method of fixing at least one back gate bias voltage to impart a desired capacitance to the transistors of at least one of the first differential transistor pair, the second differential transistor pair, or the neutralization cap.

It may be desired to provide a power amplifier circuitry having an improved reliability and/or further improve linearity of the power amplifier circuitry.

SUMMARY

It is an object of the present inventive concept to provide a power amplifier circuitry avoiding or reducing reliability issues. It is another object of the present inventive concept to provide a power amplifier circuitry having high linearity and enabling a large amplification. It is still another object of the present inventive concept to provide a power amplifier circuitry having a robustness against PVT variation and aging.

These and other objects of the present inventive concept are at least partly met by the invention as defined in the independent claims. Preferred embodiments are set out in the dependent claims.

According to a first aspect, there is provided a power amplifier circuitry, said power amplifier circuitry comprising: an input for receiving an input signal; an output for outputting an amplified output signal; a transistor stack comprising at least two stacked transistor units for amplifying the input signals, which transistor stack is arranged between the input and the output; wherein each of the at least two stacked transistor units comprises a plurality of controllable segments, each controllable segment comprising a segment transistor, wherein source terminals of the segment transistors of each of the controllable segments within each stacked transistor unit are connected together, drain terminals of the segment transistors of each of the controllable segments within each stacked transistor unit are connected together and gate terminals of the segment transistors of each of the controllable segments within each stacked transistor unit are connected together, wherein each segment transistor further comprises a back gate terminal for setting a body bias of the segment transistor, wherein at least two of the segment transistors within each of the at least two stacked transistor units have independently connected back gate terminals for independently controlling the body bias of the at least two of the segment transistors; and a control unit, which is configured to control the body bias of the plurality of controllable segments of each of the at least two stacked transistor units, wherein the control unit is configured to control the body bias for selecting an amplifier class of each of the controllable segments of each of the at least two stacked transistor units.

The power amplifier circuitry provides a stacked topology, wherein stacked transistors are provided. Thanks to the use of stacked transistors, a saturated output power may be increased.

Further, thanks to the controllable segments providing independent control of body bias of at least two of the segment transistors, it is possible to control linearity of the amplification and also to control that reliability limits of transistors are not violated.

The power amplifier may be denoted a stacked segmented power amplifier, referring to the stacked topology and the transistor units comprising controllable segments.

It is an insight of the invention, that when body bias of segment transistors of one of the transistor units is changed for improving linearity, such as OP1dB, a drain-to-source voltage (VDS) across all transistor units in the transistor stack will be changed. Hence, it is realized that if only one of the transistor units would be segmented and single transistors were used for the other transistors of the stacked transistors, the VDS would be different for the different stacked transistors. Hence, there is a risk that VDS violates reliability limits of some of the stacked transistors. However, thanks to each of the stacked transistor units comprising controllable segments, each transistor unit may be controlled to control the voltage across each of the transistor units. In such way, it may be ensured that the stacked transistors do not violate reliability limits and the functionality of the power amplifier circuitry may thus be improved.

The power amplifier circuitry provides an adaptable behavior of the amplifier. This may be used e.g. for selecting body biases of the controllable segments such that the power amplifier circuitry may for instance be used to handle PVT variations or variations due to aging of components.

The topology of the first aspect provides an elegant way of making the power amplifier circuitry linear using body bias control of the segments. Body bias control is better than gate bias control of segments as isolating the segments at the gate side and setting gate bias of segments independently would require very complex input circuitry. Also, class and gain response of a segment can be controlled more precisely using body bias than gate bias as they are less sensitive to body bias.

The input may be an input transformer. The output may be an output transformer. However, it should be realized that the input and output are not necessarily implemented as transformers and that other types of input/output may be used.

A transistor unit may comprise a plurality of controllable segments. It should be realized that the transistor unit, in addition to the controllable segments may comprise segments which are not controllable. Further, it should be realized that while at least two of the segment transistors have independently connected back gate terminals for independently controlling the body bias of the at least two of the segment transistors, the controllable segments may comprise segment transistors having back gate terminals that are connected. Thus, the plurality of controllable segments may include two or more groups of segment transistors, wherein the body bias of the segment transistors of each group may be independently controlled.

As used herein, the term "stacked transistor units" should be understood as a source terminal of a transistor unit being arranged closer to the output will be connected to a drain terminal of a transistor unit being arranged closer to the input. Thus, the transistor units need not be physically stacked on top of each other, but may be stacked in relation to how the transistor units are connected in the power amplifier circuitry.

The controllable segments within a transistor unit may be connected with source terminals of the segment transistors being connected together, drain terminals of the segment transistors being connected together and gate terminals of the segment transistors being connected together. However, it should be understood that the controllable segments of a transistor unit are not connected in this way to the controllable segments of another transistor unit. Rather, as mentioned above, the source terminals of the controllable segments of a transistor unit being arranged closer to the output may be connected to the drain terminals of a transistor unit being arranged closer to the input.

The amplifier class of a transistor defines power amplification characteristics of the transistor. Hence, by controlling an amplifier class of a controllable segment, amplification characteristics may be controlled. By further controlling a distribution of the amplifier class of segments within a transistor unit, amplifier characteristics of the transistor unit may be controlled accurately. It should be realized that amplifier characteristics may be changed such that a controllable segment may be set e.g. to a class-AB power amplifier or a class-C power amplifier or anywhere in-between.

According to an embodiment, the control unit is configured to control linearity of the power amplifier circuitry by controlling a number of segments of each of the at least two stacked transistor units being set to perform as a class-AB amplifier compared to a number of segments being set to perform as a class-C amplifier.

A class-AB power amplifier has a compressive amplifier behavior between low output power and saturated output power. The compressive amplifier behavior implies that gain decreases with increasing input power. A class-C amplifier has an expansive amplifier behavior between low output power and saturated output power. The expansive amplifier behavior implies that gain increases with increasing input power. It should be realized that even though the class-C amplifier may be described as an expansive amplifier, the class-C amplifier has an expansive behavior at lower output power levels and then has a compressive behavior at higher output power levels. The class-AB amplifier exhibits compressive amplifier behavior at all power levels.

The compressive amplifier behavior of class-AB power amplifiers and the expansive amplifier behavior of class-C power amplifiers may be combined such that by controlling a suitable relation between number of segments performing as class-AB amplifiers and number of segments performing as class-C amplifiers, the overall gain characteristics of the power amplifier circuitry may be controlled to provide a linear gain response over a very large range between low output power and saturated output power.

According to an embodiment, the gate terminals of the segment transistors within each transistor unit are connected to a common DC bias.

The body bias provides a control of the power amplifier behavior by a relation between the body bias and the gate bias. The common DC bias of the segment transistors may be set such that the segment transistors may be changed from class-AB power amplifiers to class-C power amplifiers and anywhere in-between by changing the body bias.

Having a common DC bias to the gate terminals of the segment transistors may also imply that the body bias of the segment transistors will control the power amplifier behavior of the segment transistors in the same manner.

The DC bias of each of the gate terminals may be set properly to allow control of the segment transistors by changing body bias. The DC bias may be provided through a resistor connected to a bias voltage. This may e.g. be used for a stacked transistor unit arranged with the source terminal connected to a drain terminal of another transistor unit.

According to an embodiment, the input is configured to provide a differential signal to a pair of transistor stacks, each comprising at least two stacked transistor units for amplifying each of the differential input signals and wherein the output is configured to output an amplified signal based on the amplified differential signals.

This allows the power amplifier circuitry to provide amplification of differential signals. It should however be realized that, in other embodiments, the power amplifier circuitry may be single-ended.

The pair of transistor stacks thus provide one stack for amplification of each of the differential signals. Each stack in the pair of stacks comprises at least two stacked transistor units.

According to an embodiment, a pair of first transistor units in the pair of transistor stacks are arranged with source terminals of the first transistor units connected together to ground.

According to an embodiment, the gate terminals of the segment transistors within the pair of first transistor units in the pair of transistor stacks are connected to the input for receiving the differential signals, wherein the input is connected to a DC bias for providing a common DC bias to the gate terminals of the segment transistors within the pair of first transistor units.

Hence, the gate terminals of the segment transistors of the pair of first transistor units may be configured to receive both the input signal and a DC bias. This may be a suitable way of providing a DC bias to the segment transistors. In an embodiment, a DC bias may be provided through a center tap of a coil of an input transformer.

According to an embodiment, an upper transistor unit in the transistor stack is configured with the source terminals of the segment transistors connected to the drain terminals of the segment transistors of a lower transistor unit, wherein the body bias of the back gate terminals of the segment transistors of the upper transistor unit is controlled to avoid that the transistor units violate reliability limits.

The controllable segments of the first transistor unit having gate terminals connected to the input signal may be controlled such that gain characteristics of the transistor unit are controlled. In view of such control, the VDS may be changed for transistor unit(s). The controllable segments of the upper transistor unit(s) may thus be controlled to avoid that the transistors of the transistor units violate reliability limits.

According to an embodiment, the power amplifier circuitry further comprises a coupler and a detector configured to measure a power of the output signal, said control unit controlling the body bias of the plurality of controllable segments of each of the at least two stacked transistor units based on the measured power of the output signal.

The coupler may be used for extracting a portion of the output signal to be provided to the detector. The detector may thus measure the power of the output signal. By measuring the power of the output signal, characteristics of the power amplifier circuitry may be determined. This may further be used to control the power amplifier circuitry by controlling behavior of the controllable segments.

The detector may be a power detector that may directly measure a power of the output signal. However, the detector may be of another type, which may measure a property relating to the power, such as an envelope detector which may be used for calculating power indirectly.

In this manner, power amplifier characteristics may be changed. This may be used to handle PVT variations in the circuitry. Also, it may be used to handle aging of components to handle changes over time of the power amplifier characteristics.

The measurements and control may be performed before the power amplifier circuitry is taken into use. The measurements and control may also be performed at regular intervals to monitor the power amplifier behavior.

According to an embodiment, the control unit is configured to receive measures of power of the output signal for a plurality of different input powers of the input signal, wherein the control unit is further configured to determine gain characteristics of the power amplifier circuitry based on the received measures and to iteratively change body bias of a number of segments to change the gain characteristics of the power amplifier circuitry.

Thus, the input power may be swept such that the gain characteristics over an input power range may be determined. By iteratively changing body bias of the number of segments for changing gain characteristics of the power amplifier circuitry, the gain characteristics of the power amplifier circuitry may be stepwise improved. The changing of the body bias of segments may imply that an amplifier class of the segments is changed. However, the gain characteristics of the power amplifier circuitry may also be changed by changing body bias such that segments remain within the same amplifier class. The control unit may terminate iterations when it is determined that the gain characteristics are no longer improved.

According to an embodiment, the segment transistors are n-type metal-oxide-semiconductor transistors formed by a fully-depleted silicon-on-insulator process.

This may be suitable, because such NMOS transistors may provide isolated back gate terminals, which may be needed to allow independent control of body bias of segment transistors.

According to an embodiment, all segment transistors are identical transistors.

The segment transistors may thus have similar behavior (depending e.g. on PVT variations) which may be suitable as the segment transistors may be similarly controlled. However, it should be realized that different dimensions of segment transistors may be used with control adapted to the characteristics of the respective segment transistors.

According to an embodiment, the transistor stack comprises at least three stacked transistor units.

This may be useful as it may provide a high saturated output power.

According to a second aspect, there is provided a method for controlling a power amplifier circuitry, wherein the power amplifier circuitry comprises a transistor stack comprising at least two stacked transistor units, each transistor unit comprising a plurality of controllable segments, each controllable segment comprising a segment transistor, wherein source terminals of the segment transistors of each of the controllable segments within each stacked transistor unit are connected together, drain terminals of the segment transistors of each of the controllable segments within each stacked transistor unit are connected together and gate terminals of the segment transistors of each of the controllable segments within each stacked transistor unit are connected together, wherein each segment transistor further comprises a back gate terminal for setting a body bias of the segment transistor, wherein at least two of the segment transistors within each of the at least two stacked transistor units have independently connected back gate terminals for independently controlling the body bias of the at least two of the segment transistors; said method comprising: receiving input of gain characteristics of the power amplifier circuitry, and based on the received input, setting a changed body bias for one or more of the segment transistors within each of the stacked transistor units.

Effects and features of this second aspect are largely analogous to those described above in connection with the first aspect. Embodiments mentioned in relation to the first aspect are largely compatible with the second aspect.

Thanks to the method, the power amplifier circuitry may be adapted to control the gain characteristics of the power amplifier circuitry. The control may ensure that linearity of gain is provided for a large range between a low output power and a saturated output power.

The control may utilize changing of body bias for one or more segment transistors in a transistor unit for changing gain characteristics of the power amplifier circuitry.

The changing of the body bias may cause change of an amplifier class of one or more controllable segments. The change of amplifier class may change overall characteristics of the transistor unit, which may be used to improve linearity of the gain characteristics of the power amplifier circuitry. Thanks to the power amplifier circuitry comprising controllable segments for each of the stacked transistor units, it is possible to control linearity of the amplification and also to control that reliability limits of transistors are not violated. However, it should be realized that the amplifier class of a controllable segment need not necessarily be changed in order to improve linearity of the gain characteristics of the power amplifier circuitry. Thus, the body bias may be changed towards changing an amplifier class without the amplifier class necessarily being changed.

According to an embodiment, the method further comprises determining whether the gain characteristics is compressive between low output power and a saturated output power of the power amplifier, and upon determining that the gain characteristics is compressive, setting a changed body bias for one or more of the segment transistors to a lower bias voltage.

A determination that the gain characteristics is compressive may correspond to determining that the power amplifier circuitry provides a constant gain from a low output power to a certain power level, at which gain decreases.

Thus, by lowering the body bias for one or more of the segment transistors, the characteristics of these transistors are changed towards the segment transistors performing as class-C power amplifiers and, hence, making overall gain characteristics more linear.

According to an embodiment, the method further comprises determining whether the gain characteristics is expansive between low output power and a saturated output power of the power amplifier, and upon determining that the gain characteristics is expansive, setting a changed body bias for one or more of the segment transistors to a higher bias voltage.

A determination that the gain characteristics is expansive may correspond to determining that the power amplifier circuitry provides a constant gain from a low output power to a certain power level, at which gain increases. It should be realized that even though gain characteristics are described as expansive, the power amplifier circuitry may have an expansive behavior at lower output power levels and then have a compressive behavior at higher output power levels.

Thus, by increasing the body bias for one or more of the segment transistors, the characteristics of these transistors are changed towards the segment transistors performing as class-AB power amplifiers and, hence, making overall gain characteristics more linear.

According to an embodiment, the method further comprises measuring a power of an output signal from the power amplifier circuitry for a plurality of different input powers of an input signal to the power amplifier circuitry, and determining the gain characteristics of the power amplifier circuitry based on the received measures.

Hence, a plurality of relations between output power and input power for different signal levels may be acquired. This may be used for determining changes in gain for different signal levels and, thus, for determining whether the gain characteristics are compressive and/or expansive.

For instance, an input power may be swept over a range to perform measurements for the plurality of different input powers. The input power may be continuously swept. According to an alternative, the input power may be changed between a number of discrete signal levels (not necessarily provided in sequence of increasing or decreasing signal levels) for performing measurements for the plurality of different input powers.

According to an embodiment, the method further comprises iteratively changing body bias of a number of controllable segments, measuring the power of the output signal and determining the gain characteristics.

By iteratively changing the body bias of the number of segments for changing gain characteristics of the power amplifier circuitry, the gain characteristics of the power amplifier circuitry may be stepwise improved. The stepwise improvement may bring the gain characteristics of the power amplifier circuitry towards optimal characteristics without a risk that optimal settings are not identified in the changing of the characteristics of the power amplifier circuitry.

According to an embodiment, said iterative changing of the body bias of the number of controllable segments is terminated when linearity of gain characteristics due to the changing is not improved.

Thus, when optimal characteristics in relation to linearity of gain are determined, the iterative control may be terminated.

According to an embodiment, the body bias of the at least two of the segment transistors is controlled for adapting the power amplifier circuit to process, voltage and temperature (PVT) variations and/or to aging of the power amplifier circuitry.

The method provides an adaptable control of behavior of the power amplifier circuitry. This may be used e.g. for selecting body biases of the controllable segments such that the power amplifier circuitry may for instance be used to handle PVT variations or variations due to aging of components.

According to an embodiment, the power amplifier circuitry is operated in a high gain mode by setting the body bias of all segment transistors of all transistor units to a maximum value.

Although described above in relation to providing linear gain characteristics, it should be realized that the control of the power amplifier circuitry may be used for other purposes. Thus, in some situations, other characteristics of the power amplifier circuitry may be more important, and linearity of gain characteristics may be sacrificed.

Thus, the power amplifier circuitry may be controlled to be operated in a high gain mode. In such case, the body biases for all segment transistors may be set to a maximum possible value, which may imply that gain of the power amplifier circuitry is maximized.

The control of the power amplifier circuitry may change between operating in a high linearity mode, wherein the power amplifier circuitry is controlled with respect to providing linear gain characteristics, and the high gain mode.

BRIEF DESCRIPTION OF THE DRAWINGS

The above, as well as additional objects, features and advantages of the present inventive concept, will be better understood through the following illustrative and non-limiting detailed description, with reference to the appended drawings. In the drawings like reference numerals will be used for like elements unless stated otherwise.

DETAILED DESCRIPTION

Figure 1:
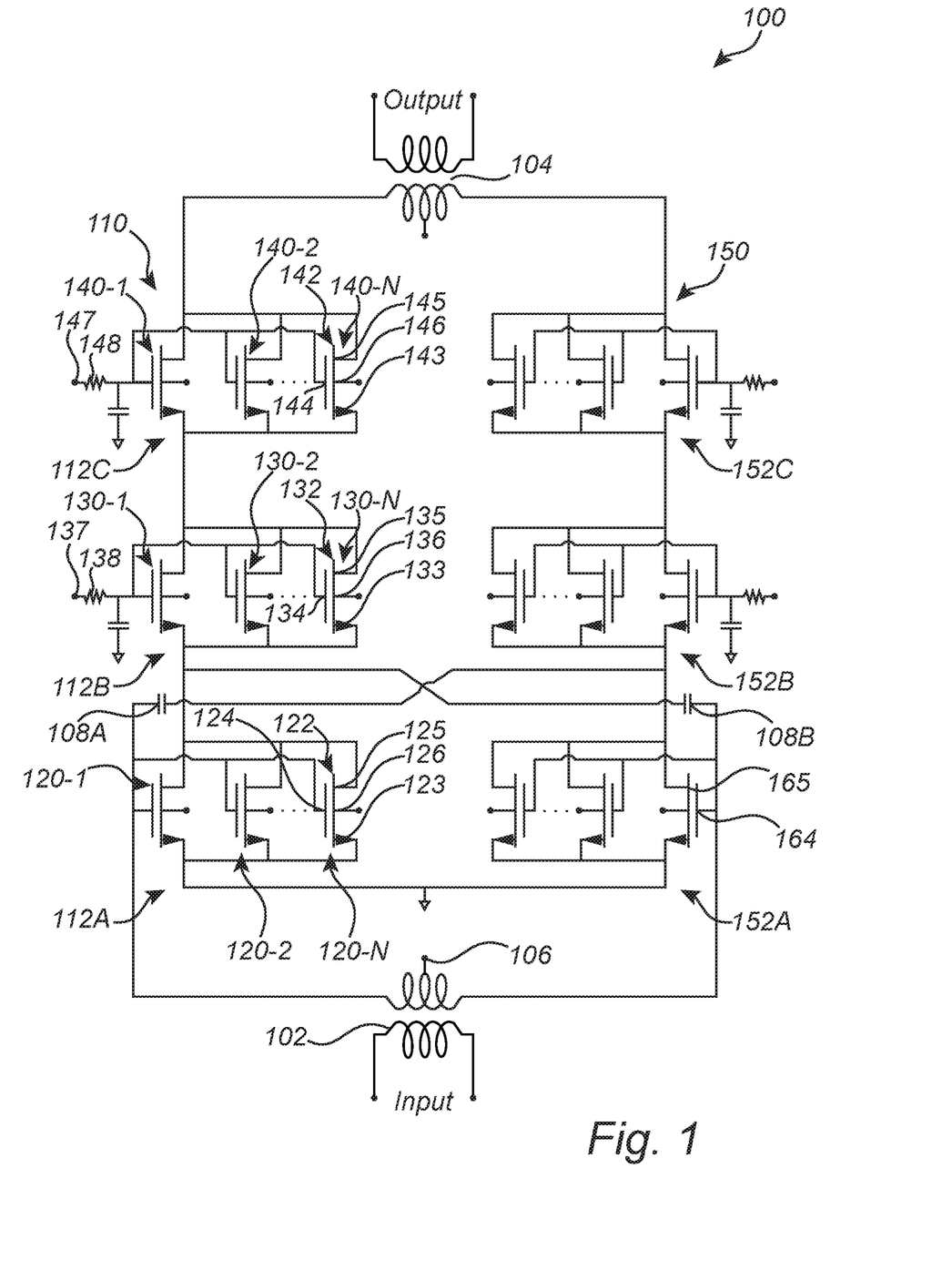
FIG. 1 is a schematic view of a power amplifier circuitry according to an embodiment.

FIG. 1 illustrates a power amplifier circuitry 100 according to an embodiment. The power amplifier circuitry 100 comprises stacked transistor units 112A, 112B, 1120; 152A, 152B, 152C for providing a high saturated output power of the power amplifier circuitry 100. The power amplifier circuitry 100 is configured to amplify differential signals, and hence is shown including a pair of a first transistor stack 110 and a second transistor stack 150, but it should be realized that the power amplifier circuitry 100 may alternatively be single-ended and comprise a single transistor stack.

The power amplifier circuitry 100 comprises an input transformer 102 for receiving an input differential signal. However, it should be realized that other types of inputs may be used instead.

The power amplifier circuitry 100 comprises an output transformer 104 for outputting an amplified differential signal. However, it should be realized that other types of outputs may be used instead.

Each transistor stack 110, 150 comprises a plurality of stacked transistors 112A, 112B, 1120; 152A, 152B, 152C. For simplicity and brevity, the description below is made mainly in relation to only the first transistor stack 110, but it should be realized that the second transistor stack 150 may be configured in similar way.

The transistor stack comprises a first transistor unit 112A, a second stacked transistor unit 1126 and a third stacked transistor unit 112C. It should be realized that the transistor stack comprises at least two transistor units, but may comprise any number of stacked transistor units such as three, four or five transistor units.

Each transistor unit 112A, 1126, 112C comprises a plurality of controllable segments 120-1 to 120-N, 130-1 to 130-N and 140-1 to 140-N. For simplicity and brevity, the description below is made mainly in relation to only one of the transistor units 112A, but it should be realized that the other transistor units 112B, 112C may be configured in similar way. Differences between the transistor units 112A, 1126, 112C will be discussed below.

The first transistor unit 112A thus comprises a plurality of controllable segments 120-1 to 120-N. Each controllable segment 120-1 to 120-N comprises a segment transistor 122 having a source terminal 123, a gate terminal 124, a drain terminal 125 and a back gate terminal 126.

The source terminals 123 of the segment transistors 122 of each of the controllable segments 120-1 to 120-N are connected together. The drain terminals 125 of the segment transistors 122 of each of the controllable segments 120-1 to 120-N are connected together. The gate terminals 124 of the segment transistors 122 of each of the controllable segments 120-1 to 120-N are also connected together. The back gate terminals 126 for setting a body bias of the segment transistor 122 are isolated, such that the body bias of the segment transistors 122 may be set independently for each of the controllable segments 120-1 to 120-N.

The power amplifier circuitry 100 may be manufactured using 22 nm fully depleted silicon-on-isolator (FDSOI) process, for which n-type metal-oxide-semiconductor (NMOS) transistors may be provided with isolated back gate terminals. However, it should be realized that other types of transistors may alternatively be used.

Although the controllable segments 120-1 to 120-N are shown in FIG. 1 as each having an independently controlled back gate terminal 126, it should be realized that at least two of the segment transistors 122 have independently connected back gate terminals 126 for independently controlling the body bias of the at least two of the segment transistors. This implies that two of the segment transistors 122 may be separately controlled. For instance, the controllable segments 120-1 to 120-N may be grouped into two or more groups, wherein all controllable segments 120-1 to 120-N within a group may be controlled in common. It should also be realized that the transistor unit 112A may comprise one or more additional segments in addition to the controllable segments 120-1 to 120-N. The additional segment may comprise a segment transistor having a source terminal connected to the source terminals 123 of the segment transistors 122 of the controllable segments 120-1 to 120-N, a drain terminal connected to the drain terminals 125 of the segment transistors 122 of the controllable segments 120-1 to 120-N, and a gate terminal connected to the gate terminals 124 of the segment transistors 122 of the controllable segments 120-1 to 120-N. Further, the segment transistor of the additional segment may have a back gate terminal, which may be provided with a fixed bias.

Unlike the other transistor units 1126, 112C, the first transistor unit 112A is connected with the source terminals 123 of the segment transistors 122 being connected to ground and the gate terminals 124 of the segment transistors 122 being connected to receive an input signal from the input transformer 102. The input transformer 102 may also be connected to a bias voltage 106 for providing a DC bias voltage to the gate terminals 124.

Thus, the first transistor unit 112A may be connected in a common source configuration. This may be suitable for amplification of a voltage signal.

The second transistor unit 1126 is connected with the source terminals 133 of the segment transistors 132 being connected to the drain terminals 125 of the segment transistors 122 of the first transistor unit 112A.

The third transistor unit 112C is connected with the source terminals 143 of the segment transistors 142 being connected to the drain terminals 135 of the segment transistors 132 of the second transistor unit 112B. The third transistor unit 112C is further connected with the drain terminals 145 of the segment transistors 142 being connected to the output transformer 104 for outputting the amplified signal.

The gate terminals 134, 144 of the segment transistors 132, 142 of the second transistor unit 112B and the third transistor unit 112C may respectively be connected to a bias voltage 137, 147 through a resistor 138, 148.

The power amplifier circuitry 100 may further comprise neutralization capacitors comprising a pair of cross-connected capacitors 108A, 108B between the gate terminals 124 of the first transistor unit 112A in the first transistor stack 110 and the drain terminals 165 of the first transistor unit 152A in the second transistor stack 150 and between the gate terminals 164 of the first transistor unit 152A in the second transistor stack 150 and the drain terminals 125 of the first transistor unit 112A in the first transistor stack 110. This may act to stabilize the power amplifier circuitry 100.

The gate biases of the power amplifier circuitry 100 are set such that using body bias provided to the back gate terminals 126, 136, 146 of the transistor units 112A, 112B, 112C, an amplifier class of the controllable segments 120-1 to 120-N, 130-1 to 130-N and 140-1 to 140-N can be changed from class-AB to class-C and anywhere in between.

A class-AB power amplifier has a compressive response, while a class-C PA has expansive response. The compressive response implies that the gain decreases with increasing input power, whereas the expansive response implies that gain increases with increasing input power.

By biasing the back gate terminals 126 of the right number of controllable segments 120-1 to 120-N of the first transistor unit 112A at appropriate bias level, the compressive and expansive characteristics of the controllable segments 120-1 to 120-N may be balanced out and a very flat gain response is obtained resulting in very high output 1 dB compression point (OP1dB).

Further, the control of the first transistor unit 112A may be combined with control of the controllable segments 130-1 to 130-N and 140-1 to 140-N of the second and third transistor units 112B, 112C. For reliability of the transistor units 112A, 112B, 112C, there may be a need to ensure that the voltages across different terminals of the segment transistors 122, 132, 142 do not exceed specified voltage limits. For example, drain-to-source voltages (VDS) of the transistors 122, 132, 142 may need to be maximum 0.8V in a specific example discussed below.

In design of the stacked transistor units 112A, 112B, 112C, gate bias of the stacked transistor units 112A, 112B, 112C may be set such that the VDS across all three transistor units 112A, 112B, 112C are 0.8V. When the body bias of at least some of the controllable segments 120-1 to 120-N of the first transistor unit 112A are changed for improving OP1dB, VDS voltages across all three transistor units 112A, 112B, 112C also change violating the reliability limits in some cases. Thanks to the second and third transistor units 112B, 112C also comprising controllable segments 130-1 to 130-N and 140-1 to 140-N, the body bias of the controllable segments 120-1 to 120-N, 130-1 to 130-N and 140-1 to 140-N of all three transistor units 112A, 112B, 112C may be changed in a similar manner to maintain VDS of all three transistor units 112A, 112B, 112C within reliability limits.

In a specific example, each transistor unit 112A, 112B, 112C comprises eight controllable segments 120-1 to 120-N, 130-1 to 130-N and 140-1 to 140-N and initially body bias of all eight controllable segments 120-1 to 120-N, 130-1 to 130-N and 140-1 to 140-N of all three transistor units 112A, 112B, 112C are at 3.3V and all VDS are 0.8V. Then, the body bias for two of the controllable segments 120-1 to 120-N of the first transistor unit 112A are set to 0V and the body bias for the remaining six of the controllable segments 120-1 to 120-N are set to 3.3V. In case the second and third transistor units 112B, 112C were implemented as single transistors without segments with a body bias set to 3.3V, then the VDS across the first transistor unit 112A, the second transistor unit 112B and the third transistor unit 112C are 0.9V, 0.8V and 0.7V, respectively. If the body biases of the second and third transistor units 112B, 112C are set to 0V, then the VDS across the first transistor unit 112A, the second transistor unit 112B and the third transistor unit 112C are 0.7V, 0.8V, and 0.9V, respectively. In both these cases, VDS thus violates reliability limits. However, with the second and third transistor units 112B, 112C also being designed with segment transistors, VDS may be better controlled. By setting the body bias for two of the controllable segments 130-1 to 130-N, 140-1 to 140-N of the second and third transistor unit 112B, 112C to 0V and setting the body bias for the remaining six of the controllable segments 130-1 to 130-N, 140-1 to 140-N of the second and third transistor unit 112B, 112C to 3.3V similar to the body biases set for the first transistor unit 112A, VDS across the first transistor unit 112A, the second transistor unit 112B and the third transistor unit 112C are 0.8V, 0.8V and 0.8V, respectively, as desired.

Figure 2:
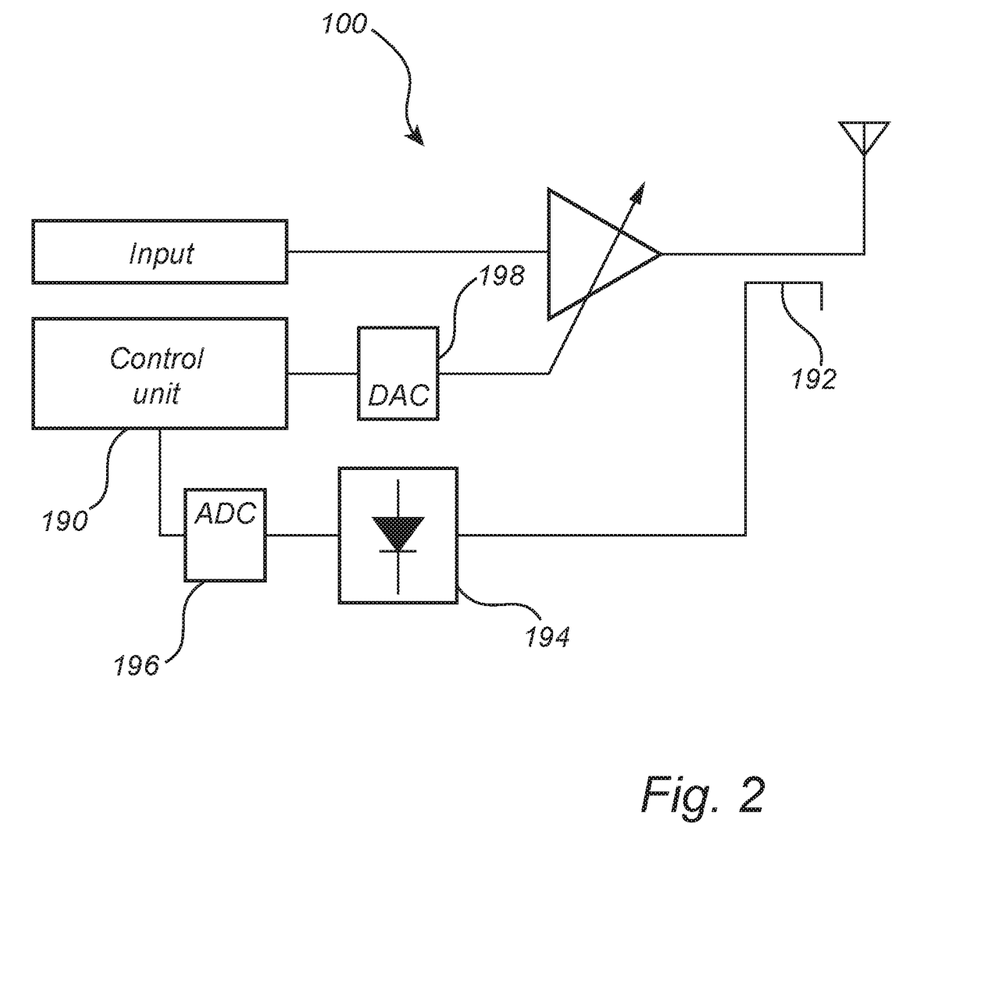
FIG. 2 is a schematic view of a power amplifier circuitry illustrating control of body bias of segment transistors of the power amplifier circuitry.

As shown in FIG. 2, the power amplifier circuitry 100 may comprise a control unit 190. The control unit 190 may be configured to control the body bias of the plurality of controllable segments 120-1 to 120-N, 130-1 to 130-N and 140-1 to 140-N. The control unit 190 may thus be configured to provide control signals for controlling the body biases.

The control unit 190 may further be configured to receive input relating to gain characteristics of the power amplifier circuitry 100 such that the control unit 190 may base control of the body biases on the received input. In an embodiment, the control unit 190 may receive measures of power of the output signal from the power amplifier circuitry 100 for a plurality of different input powers of the input signal. The control unit 190 may further be configured to determine gain characteristics of the power amplifier circuitry 100 based on the received measures. The control unit 190 may then, based on the determined gain characteristics, provide control signals for changing the body bias of one or more controllable segments 120-1 to 120-N, 130-1 to 130-N and 140-1 to 140-N to change segment transistors 122, 132, 142 from class-AB to class-C or vice versa and anywhere in between.

The control unit 190 may be implemented as a processing unit, such as a central processing unit (CPU), which may execute the instructions of one or more computer programs to implement functionality of the control unit 190.

The control unit 190 may alternatively be implemented as firmware arranged e.g. in an embedded system, or as a specifically designed processing unit, such as an Application-Specific Integrated Circuit (ASIC) or a Field-Programmable Gate Array (FPGA), which may be configured to implement functionality of the control unit 190.

In the embodiment illustrated in FIG. 2, a mm-wave signal source is used for providing input to the input transformer 102 of the power amplifier circuitry 100. The input power may be swept and output power levels of the power amplifier circuitry 100 for different input power levels may be captured through a coupler 192 connected between the output transformer 104 and an antenna for transmitting a mm-wave signal.

Thus, the output signal captured by the coupler 192 may be provided to a detector 194, here illustrated as a power detector 194. The detector 194 may be a power detector that may directly measure a power of the output signal. However, the detector may be of another type, which may measure a property relating to the power, such as an envelope detector which may be used for calculating power indirectly.

The power measurements may be provided by the detector 194 to the control unit 190, possibly via an analog-to-digital converter 196, for providing digital representations of the power measurements. The control unit 190 may thus process the power measurements digitally and may output control signals, which are provided to a digital-to-analog converter 198 for controlling the body biases of the controllable segments 120-1 to 120-N, 130-1 to 130-N and 140-1 to 140-N.

The control unit 190 may implement a bias control algorithm that searches through bias codes (corresponding to body biases of the controllable segments 120-1 to 120-N, 130-1 to 130-N and 140-1 to 140-N) and selects the one that provides most linear response (maximum OP1dB). This search can be any search algorithm. The search algorithm can be an intelligent search algorithm such as gradient descent search as the linearity response of the power amplifier circuitry 100 can be monotonic with bias values.

The control of the power amplifier circuitry 100 can be used at different process, voltage, temperature (PVT) corners and with aging of the power amplifier circuitry 100. For different PVT corners, a different set of bias codes that will result in best OP1dB may be obtained from the search performed by the control unit 190.

Figure 3:
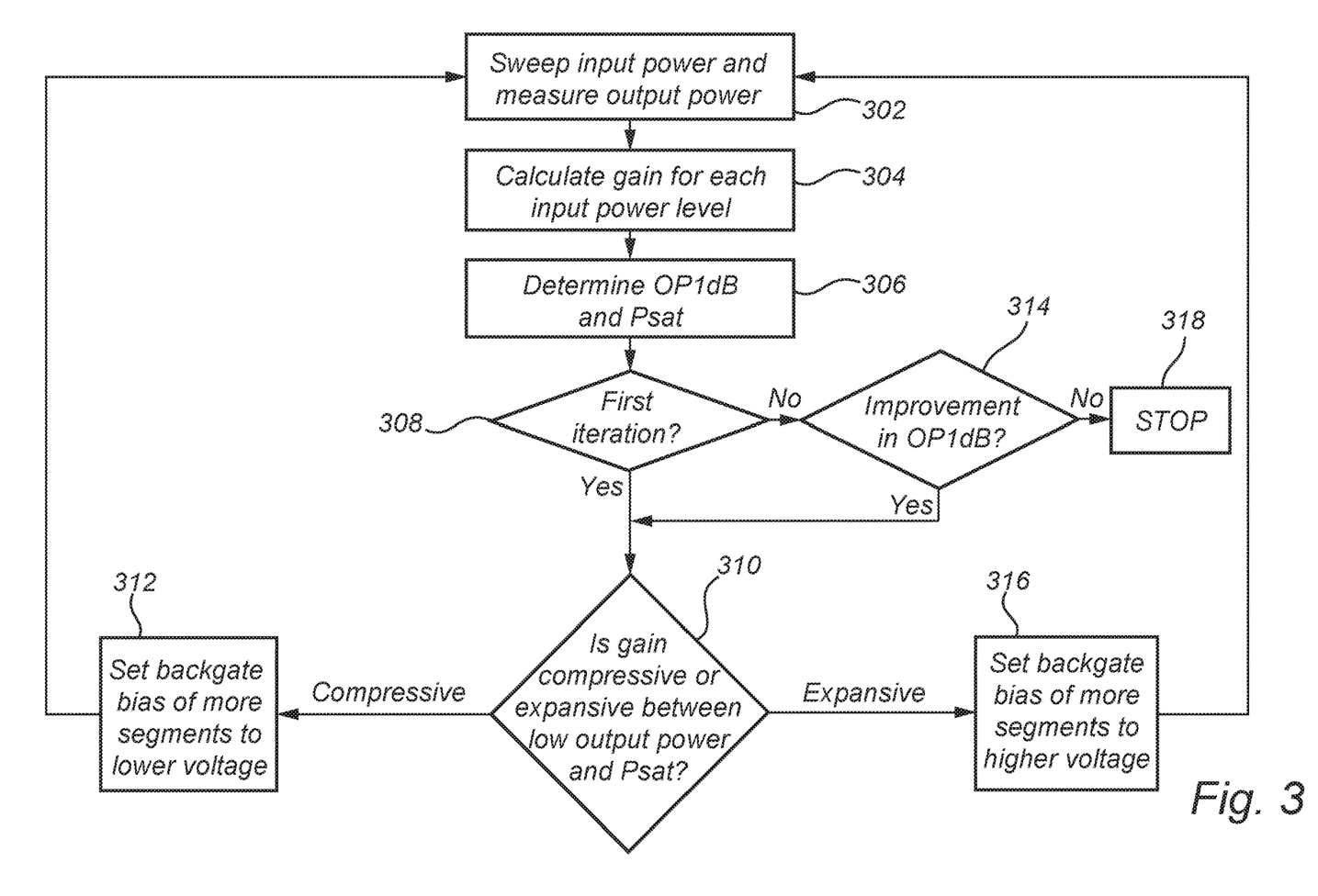
FIG. 3 is a flowchart of a method for controlling the power amplifier circuitry.

Referring now to FIG. 3, a method for controlling the power amplifier circuitry 100 according to an embodiment is described.

The method comprises sweeping 302 input power and measuring output power for different input powers. The method further comprises calculating 304 a gain for each input power level.

Based on the calculated gain, the method may further determine 306 gain characteristics such as OP1dB and saturated output power (Psat). Then, a check 308 may be made whether the determining of gain characteristics are performed in a first iteration of controlling the power amplifier circuitry.

If it is the first iteration, the method may then comprise determining 310 whether gain is compressive or expansive between low output power and Psat.

If it is determined that the gain is compressive, then the method may set 312 a body bias for one or more segment transistors 122, 132, 142 to a lower bias voltage.

Then, the sweeping 302, the calculating 304 and the determining 306 may be repeated for the new settings of body biases. The check 308 will then find that the determining of gain characteristics are not performed in a first iteration and the method may further comprise determining 314 whether an improvement in gain characteristics, such as OP1dB, is obtained by the power amplifier circuitry 100 being provided with changed body biases for one or more segment transistors 122, 132, 142.

If it is determined that the gain characteristics are improved, the method may return to 310. This may be iterated until the determining 314 finds that gain characteristics are no longer improved. Then, the iteration may be terminated 318 and the set body biases may provide optimal settings for linearity of gain characteristics of the power amplifier circuitry 100.

If the determining 310 instead finds that the gain is expansive, then the method may set 316 a body bias for one or more segment transistors 122, 132, 142 to a higher bias voltage.

Then, the sweeping 302, the calculating 304 and the determining 306 may be repeated for the new settings of body biases. The check 308 will then find that the determining of gain characteristics are not performed in a first iteration and the method may proceed to determining 314 whether an improvement in gain characteristics, such as OP1dB, is obtained by the power amplifier circuitry 100 being provided with changed body biases for one or more segment transistors 122, 132, 142.

Although described above in relation to providing linear gain characteristics, it should be realized that the control of the power amplifier circuitry 100 may be used for other purposes. Thus, in some situations, other characteristics of the power amplifier circuitry 100 may be more important and linearity of gain characteristics may be sacrificed.

Thus, the power amplifier circuitry 100 may for instance be controlled to be operated in a high gain mode. In such case, the body biases for all segment transistors 122, 132, 142 may be set to a maximum possible value, which may imply that gain of the power amplifier circuitry is maximized. The control of the power amplifier circuitry 100 may change between operating in a high linearity mode, wherein the power amplifier circuitry 100 is controlled with respect to providing linear gain characteristics, and the high gain mode.

Figure 4:
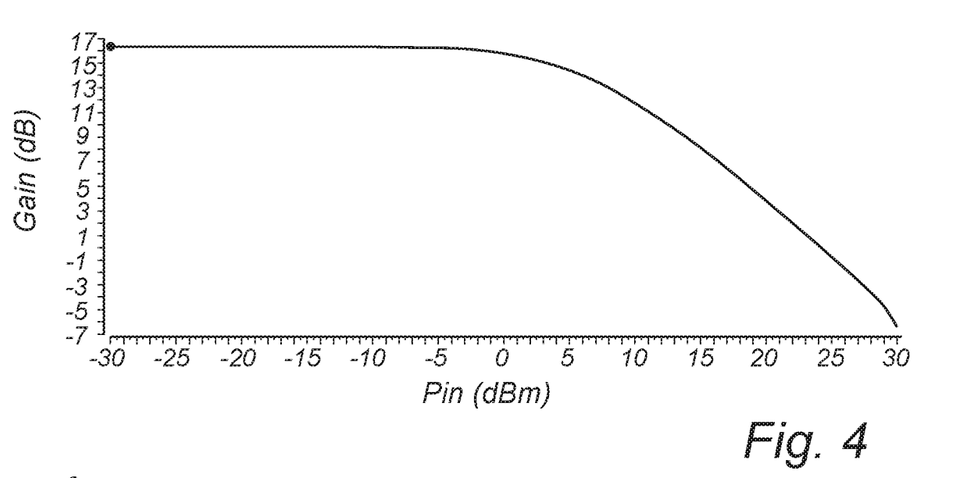
FIGS. 4-6 are charts illustrating gain characteristics of the power amplifier circuitry for different settings of body biases of controllable segments of the power amplifier circuitry.
Figure 5:
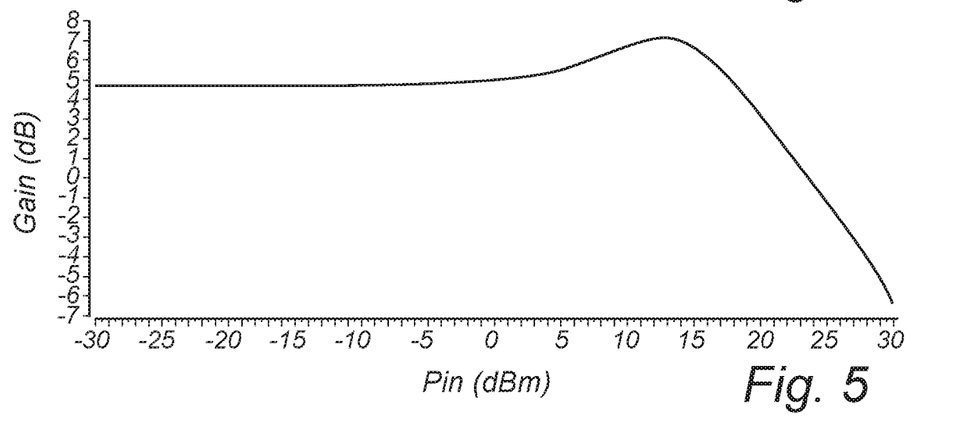
Figure 6:
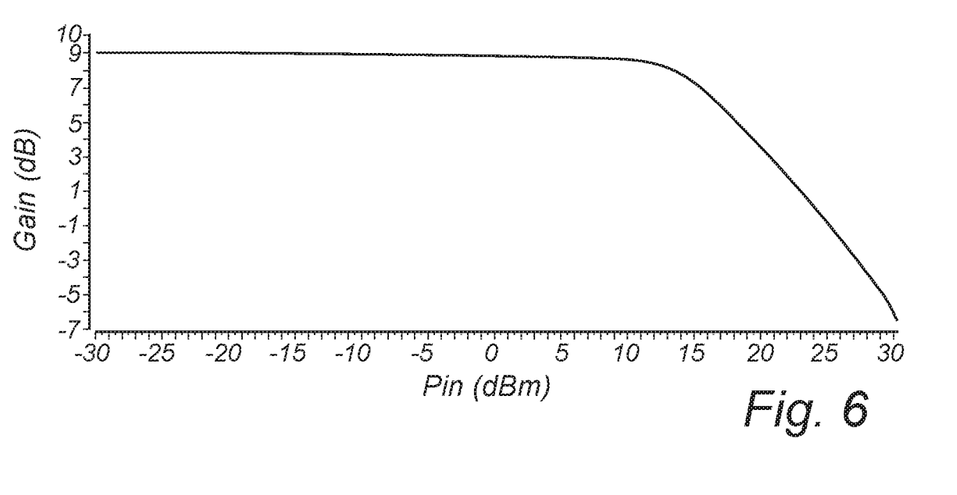

Referring now to FIGS. 4-6, gain characteristics of the power amplifier circuitry 100 in an exemplary embodiment are shown. FIGS. 4-6 illustrate gain characteristics for different settings of body biases of controllable segments 120-1 to 120-N, 130-1 to 130-N and 140-1 to 140-N of the power amplifier circuitry 100.

In the exemplary embodiment, the power amplifier circuitry 100 comprises three transistor units 112A, 112B, 112C and each of the transistor units 112A, 112B, 112C comprises eight segments.

In a first setting of body biases, all the segments of all transistor units 112A, 112B, 112C are set to a maximum possible value of 3.3V. In FIG. 4, gain characteristics of the power amplifier circuitry 100 is illustrated. A compressive gain characteristic is observed, as the power amplifier circuitry 100 is in class-AB mode (high body bias resulting in lowered threshold voltage). In this setting, small signal gain is quite high (16.3 dB), whereas OP1dB is relatively low (17.5 dBm) compared to Psat (23 dBm) and peak power-added efficiency (PAE) is relatively low (16.65%).

In a second setting of body biases, all the segments of all transistor units 112A, 112B, 112C are set to a minimum possible voltage of 0V. In FIG. 5, gain characteristics of the power amplifier circuitry 100 is illustrated. An expansive gain characteristic is observed, as the power amplifier circuitry 100 is in class-C mode (low body bias resulting in higher threshold voltage). In this setting, small signal gain is relatively low (4.7 dB), whereas peak PAE is relatively high (22%).

In a third setting of body biases, some segments are in class-AB mode and some segments are in class-C mode such that their compressive and expansive characteristics cancel each other out and a very flat and linear gain response is obtained resulting in very high OP1dB close to Psat. In the third setting, which is the optimal setting for linearity, body biases of the different segment transistors of each transistor unit are set at optimal voltages between 0V and 3.3V. As illustrated in FIG. 6, very flat and linear gain characteristics are obtained. With these settings a moderate gain (9 dB) is provided, whereas OP1dB is very high (20.5 dBm) and peak PAE is high (22%).

In the above the inventive concept has mainly been described with reference to a limited number of examples. However, as is readily appreciated by a person skilled in the art, other examples than the ones disclosed above are equally possible within the scope of the inventive concept, as defined by the appended claims.

The invention claimed is:

1. A power amplifier circuitry, said power amplifier circuitry comprising:
    an input for receiving an input signal;
    an output for outputting an amplified output signal;
    a transistor stack comprising at least two stacked transistor units for amplifying the input signal, wherein the transistor stack is arranged between the input and the output;
    wherein each of the at least two stacked transistor units comprises a plurality of controllable segments, each controllable segment comprising a segment transistor, wherein source terminals of the segment transistors of each of the controllable segments within each stacked transistor unit are connected together, drain terminals of the segment transistors of each of the controllable segments within each stacked transistor unit are connected together and gate terminals of the segment transistors of each of the controllable segments within each stacked transistor unit are connected together, wherein each segment transistor further comprises a back gate terminal for setting a body bias of the segment transistor, wherein at least two of the segment transistors within each of the at least two stacked transistor units have independently connected back gate terminals for independently controlling the body bias of the at least two of the segment transistors; and
    a control unit, which is configured to control the body bias of the plurality of controllable segments of each of the at least two stacked transistor units, wherein the control unit is configured to control the body bias for selecting an amplifier class of each of the controllable segments of each of the at least two stacked transistor units.

2. The power amplifier circuitry according to claim 1, wherein the control unit is configured to control linearity of the power amplifier circuitry by controlling a number of segments of each of the at least two stacked transistor units being set to perform as a class-AB amplifier compared to a number of segments being set to perform as a class-C amplifier.

3. The power amplifier circuitry according to claim 1, wherein the gate terminals of the segment transistors within each transistor unit are connected to a common DC bias.

4. The power amplifier circuitry according to claim 1, wherein the input is configured to provide a differential signal to a pair of transistor stacks, each comprising at least two stacked transistor units for amplifying each of the differential input signals and wherein the output is configured to output an amplified signal based on the amplified differential signals.

5. The power amplifier circuitry according to claim 4, wherein a pair of first transistor units in the pair of transistor stacks are arranged with source terminals of the first transistor units connected together to ground.

6. The power amplifier circuitry according to claim 4, wherein the gate terminals of the segment transistors within the pair of first transistor units in the pair of transistor stacks are connected to the input for receiving the differential signals, wherein the input is connected to a DC bias for providing a common DC bias to the gate terminals of the segment transistors within the pair of first transistor units.

7. The power amplifier circuitry according to claim 1, wherein an upper transistor unit in the transistor stack is configured with the source terminals of the segment transistors connected to the drain terminals of the segment transistors of a lower transistor unit, wherein the body bias of the back gate terminals of the segment transistors of the upper transistor unit is controlled to avoid that the transistor units violate reliability limits.

8. The power amplifier circuitry according to claim 1, further comprising a coupler and a detector configured to measure a power of the amplified output signal, said control unit controlling the body bias of the plurality of controllable segments of each of the at least two stacked transistor units based on the measured power of the amplified output signal.

9. The power amplifier circuitry according to claim 8, wherein the control unit is configured to receive measures of power of the amplified output signal for a plurality of different input powers of the input signal, wherein the control unit is further configured to determine gain characteristics of the power amplifier circuitry based on the received measures and to iteratively change body bias of a number of segments to change the gain characteristics of the power amplifier circuitry.

10. The power amplifier circuitry according to claim 1, wherein the segment transistors are n-type metal-oxide-semiconductor transistors formed by a fully-depleted silicon-on-insulator process.

11. The power amplifier circuitry according to claim 1, wherein all segment transistors are identical transistors.

12. The power amplifier circuitry according to claim 1, wherein the transistor stack comprises at least three stacked transistor units.

13. A method for controlling a power amplifier circuitry, wherein the power amplifier circuitry comprises a transistor stack comprising at least two stacked transistor units, each transistor unit comprising a plurality of controllable segments, each controllable segment comprising a segment transistor, wherein source terminals of the segment transistors of each of the controllable segments within each stacked transistor unit are connected together, drain terminals of the segment transistors of each of the controllable segments within each stacked transistor unit are connected together and gate terminals of the segment transistors of each of the controllable segments within each stacked transistor unit are connected together, wherein each segment transistor further comprises a back gate terminal for setting a body bias of the segment transistor, wherein at least two of the segment transistors within each of the at least two stacked transistor units have independently connected back gate terminals for independently controlling the body bias of the at least two of the segment transistors;

said method comprising:
receiving input of gain characteristics of the power amplifier circuitry, and based on the received input, setting a changed body bias for one or more of the segment transistors within each of the stacked transistor units.

14. The method according to claim 13, further comprising determining whether the gain characteristics is compressive between low output power and a saturated output power of the power amplifier circuitry, and upon determining that the gain characteristics is compressive, setting a changed body bias for one or more of the segment transistors to a lower bias voltage.

15. The method according to claim 13, further comprising determining whether the gain characteristics is expansive between low output power and a saturated output power of the power amplifier circuitry, and upon determining that the gain characteristics is expansive, setting a changed body bias for one or more of the segment transistors to a higher bias voltage.

16. The method according to claim 13, further comprising measuring a power of an output signal from the power amplifier circuitry for a plurality of different input powers of an input signal to the power amplifier circuitry, and determining the gain characteristics of the power amplifier circuitry based on the received measures.

17. The method according to claim 16, further comprising iteratively changing body bias of a number of controllable segments, measuring the power of the output signal and determining the gain characteristics.

18. The method according to claim 17, wherein said iteratively changing of the body bias of the number of controllable segments is terminated when linearity of gain characteristics due to the changing is not improved.

19. The method according to claim 13, wherein the body bias of the at least two of the segment transistors is controlled for adapting the power amplifier circuity to process, voltage and temperature (PVT) variations and/or to aging of the power amplifier circuitry.

20. The method according to claim 13, wherein the power amplifier circuitry is operated in a high gain mode by setting the body bias of all segment transistors of all transistor units to a maximum value.

* * * * *